United States Patent
Chung et al.

(10) Patent No.: US 6,706,633 B2
(45) Date of Patent: Mar. 16, 2004

(54) METHOD OF FORMING A SELF-ALIGNED CONTACT PAD FOR USE IN A SEMICONDUCTOR DEVICE

(75) Inventors: Dae-Hyuk Chung, Sungnam (KR); Han-Joo Lee, Seoul (KR); In-Seak Hwang, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/115,430

(22) Filed: Apr. 4, 2002

(65) Prior Publication Data
US 2002/0155687 A1 Oct. 24, 2002

(30) Foreign Application Priority Data
Apr. 24, 2001 (KR) ......................... 2001-22101

(51) Int. Cl.[7] ................. H01L 21/302; H01L 21/44; H01L 29/00; H01L 29/40
(52) U.S. Cl. ............ 438/691; 438/633; 438/637; 438/675; 257/520; 257/621
(58) Field of Search ............. 438/689–693, 438/611, 612, 618, 633, 637, 674, 675, 684; 257/621, 503, 520

(56) References Cited

U.S. PATENT DOCUMENTS

| | | | | | |
|---|---|---|---|---|---|
| 5,707,883 A | * | 1/1998 | Tabara | ............... | 437/40 |
| 6,337,275 B1 | * | 1/2002 | Cho et al. | ............... | 438/675 |
| 6,455,381 B1 | * | 9/2002 | Shimizu et al. | ........... | 438/296 |

* cited by examiner

Primary Examiner—Matthew Smith
Assistant Examiner—Lee Calvin
(74) Attorney, Agent, or Firm—Lee & Sterba, P.C.

(57) ABSTRACT

A method of forming a self-aligned contact pad for use in a semiconductor device, including: forming a gate having a gate mask formed thereon on a semiconductor substrate, the semiconductor substrate including an active region and a non-active region, forming a spacer on both sidewalls of the gate and the gate mask, forming an interlayer insulating layer over the entire surface of the semiconductor substrate, the interlayer insulating layer including an opening formed on the active region of the semiconductor substrate, forming a conductive material layer over the entire surface of the semiconductor substrate to cover the interlayer insulating layer, etching-back the conductive material layer until the interlayer insulating layer is exposed, and performing a multi-step CMP process to form contact pads in the opening of the interlayer insulating layer, such that the contact pads are electrically insulated from each other.

9 Claims, 8 Drawing Sheets

METHOD OF FORMING A SELF-ALIGNED CONTACT PAD FOR USE IN A SEMICONDUCTOR DEVICE

BACKGROUND OF THE INVENTION

1. Field of the Invention

The present invention relates to a semiconductor device. More particularly, the present invention relates to a method of forming a self-aligned contact pad for use in a semiconductor device.

2. Description of the Related Art

As methods for forming semiconductor devices become more complex, a bar-type self-aligned contact (SAC) process is used in a method for forming a direct contact (DC) pad and a bit line contact (BC) pad instead of a more conventional hole-type SAC. The method for forming a DC pad and a BC pad additionally includes a chemical mechanical polishing (CMP) process to increase a process margin.

A conventional method for forming a self-aligned contact pad includes depositing a polysilicon layer, etching back the polysilicon layer, and performing a CMP process using a CMP slurry for an oxide layer to form a DC pad and a BC pad.

FIGS. 1A to 1E illustrate cross-sectional views of a conventional process of forming a self-aligned contact pad for use in a semiconductor device.

First, as shown in FIG. 1A, a semiconductor substrate 10 includes an active region 11 and a non-active region having a device isolation layer 12. A plurality of gates 20 are formed on corresponding gate oxide layers 21, respectively. Each of the plurality of gates 20 includes a polysilicon layer 22 and a tungsten silicide layer 23 sequentially stacked on the gate oxide layer 21. A nitride layer is formed on a corresponding tungsten silicide layer 23 as a gate mask 30. Thereafter, a nitride spacer 40 is formed on both sidewalls of the gate 20 and the gate mask 30.

As shown in FIG. 1B, an interlayer insulating layer 50 is deposited over the entire surface of the semiconductor substrate 10 and then etched to form an opening 51. In a subsequent process, DC pads and BC pads will be formed on portions of the active region exposed by the opening 51. The interlayer insulating layer 50 is made of a high-density plasma (HDP) oxide layer.

Subsequently, as shown in FIG. 1C, a polysilicon layer 60 is deposited over the entire surface of the semiconductor substrate 10.

Then, as shown in FIG. 1D, the polysilicon layer 60 is etched-back to electrically insulate the contact pads until the HDP oxide interlayer insulating layer 50 is exposed, so that the polysilicon layer 60 remains in the opening 51. Thereafter, the HDP oxide interlayer insulating layer 50 is over-etched by, for example, 500 Å.

As shown in FIG. 1E, the HDP oxide interlayer insulating layer 50 and the polysilicon layer (60 of FIG. 1D) are planarized by a CMP process to electrically insulate the contact pads, thereby forming the contact pads, i.e., DC pads 61 that are bit line self-aligned contact pads and BC pads 62 that are storage node self-aligned contact pads.

However, the conventional method of forming the self-aligned contact pads has the following disadvantages. When the HDP oxide interlayer insulating layer 50 is over-etched, flat zones of a wafer are etched more than other areas due to a uniformity property of dry etching equipment. This excessive over-etching of flat zones of a wafer causes the gate mask 30 of chips on the flat zone of the wafer to be exposed. Since the CMP process is performed in this state, more of the nitride layer 30 (i.e., gate mask) is consumed, and the nitride layer 30 becomes relatively thin. For example, the nitride layer 30 has an average thickness of about 500 Å, but the nitride layer 30 of the chips on the flat zone of the wafer, e.g., a portion of the nitride layer 30, indicated by reference numeral 70 in FIG. 1E, may be over-etched by 250 Å or more. This over-etching may result in a portion of the gate 30 being exposed, thereby causing a defect such as a short circuit between the gate 20 and the contact pads 61 and 62.

SUMMARY OF THE INVENTION

To overcome the problems described above, a preferred embodiment of the present invention provides a method of forming a self-aligned contact pad, which may prevent defects such as a short circuit between a gate and a contact pad.

In order to provide the above-mentioned feature, a preferred embodiment of the present invention provides a method of forming a self-aligned contact pad for use in a semiconductor device. The method includes: forming a gate having a gate mask formed thereon on a semiconductor substrate, the semiconductor substrate including an active region and a non-active region, forming a spacer on both sidewalls of the gate and the gate mask, forming an interlayer insulating layer over the entire surface of the semiconductor substrate, the interlayer insulating layer including an opening formed on the active region of the semiconductor substrate, forming a conductive material layer over the entire surface of the semiconductor substrate to cover the interlayer insulating layer, etching-back the conductive material layer until the interlayer insulating layer is exposed, and performing a multi-step CMP process to form contact pads in the opening of the interlayer insulating layer, such that the contact pads are electrically insulated from each other.

Preferably, the multi-step CMP process includes a first CMP process for etching the conductive material layer and the interlayer insulating layer using a first slurry; and a second CMP process for etching the conductive material layer using a second slurry, wherein the second slurry has a higher selectivity in the conductive material layer than in the gate mask to form the contact pads.

The first CMP process is preferably performed using the first slurry until the gate mask is exposed. The first slurry is preferably an oxide slurry such that an etching selectivity ratio of the gate mask, the conductive material layer and the interlayer insulating layer is 1:2:2. The gate mask is preferably a nitride layer, the conductive material layer is preferably a polysilicon layer, and the interlayer insulating layer is preferably a high density plasma (HDP) oxide layer.

In the second CMP process, a width of the gate mask exposed between the contact pads is preferably at least 30 nm, and a thickness of the gate mask is preferably at least 300 Å. The second slurry is preferably a poly slurry such that an etching selectivity ratio of the gate mask and the polysilicon layer is 1:50. The gate mask is preferably a nitride layer, the conductive material layer is preferably a polysilicon layer, and the interlayer insulating layer is preferably a HDP oxide layer. After etching-back the conductive material layer until the interlayer insulating layer is exposed, the method may further include over-etching the interlayer insulating layer. The gate may include a gate oxide layer, a polysilicon layer and a tungsten silicide layer sequentially stacked on the semiconductor substrate.

In a method of the present invention, the self-aligned contact pads are formed using a multi-step CMP process, i.e., a two-step CMP process, and therefore excessive consumption of the nitride layer may be prevented, thereby preventing a defect such as a short circuit between the gate and the contact pads.

BRIEF DESCRIPTION OF THE DRAWINGS

For a more complete understanding of the present invention and the features and advantages thereof, reference is now made to the following descriptions taken in conjunction with the accompanying drawings, in which like reference numerals represent like elements throughout, and in which.

DETAILED DESCRIPTION OF THE INVENTION

Korean Patent Application No. 2001-22101, filed Apr. 24, 2001, and entitled "Method of Forming a Self-Aligned Contact Pad for Use in a Semiconductor Device," is incorporated by reference herein in its entirety.

The present invention will now be described more fully with reference to the accompanying drawings, in which preferred embodiments of the present invention are shown. The present invention may, however, be modified in different forms and should not be construed as limited to the embodiments set forth herein. Rather, these embodiments are provided so that this disclosure will be thorough and complete, and will fully convey the scope of the present invention to those of ordinary skill in the art.

FIGS. 2A to 2F illustrate cross-sectional views of a process of forming a self-aligned contact pad according to a preferred embodiment of the present invention.

Figure 1A:
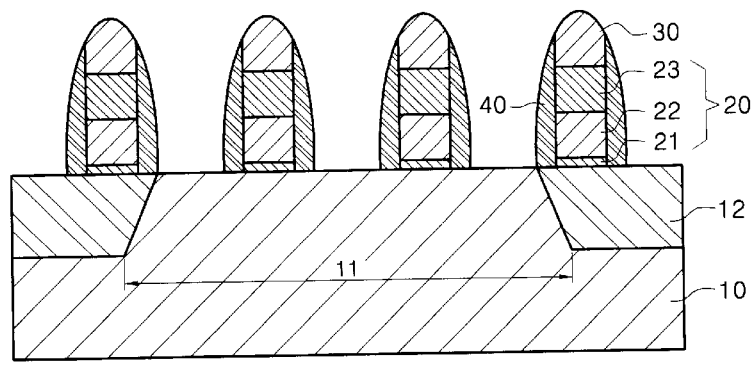
FIGS. 1A to 1E illustrate cross-sectional views of a conventional process of forming a self-aligned contact pad for use in a semiconductor device.
Figure 1B:
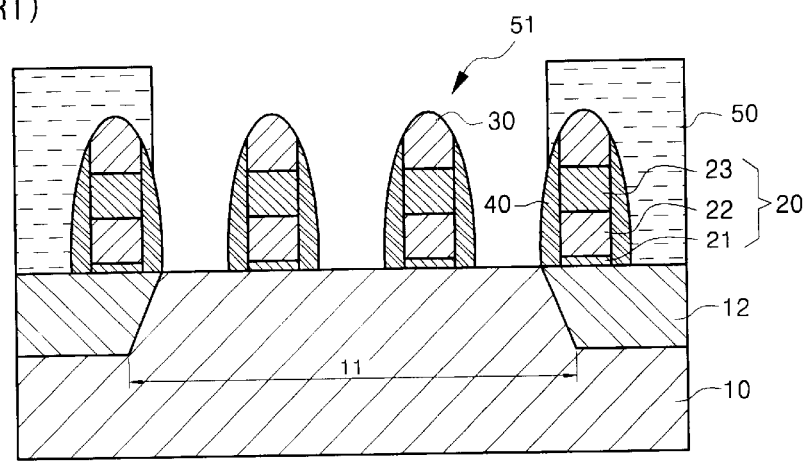
Figure 1C:
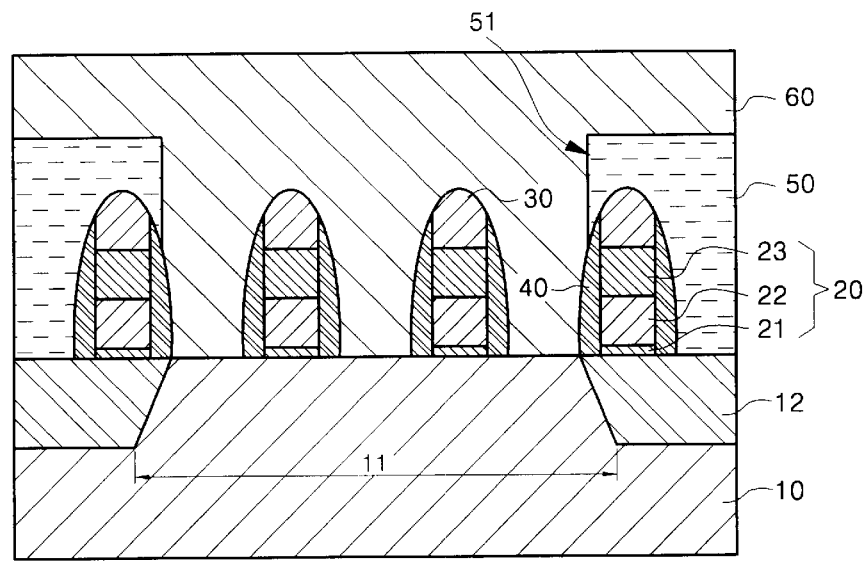
Figure 1D:
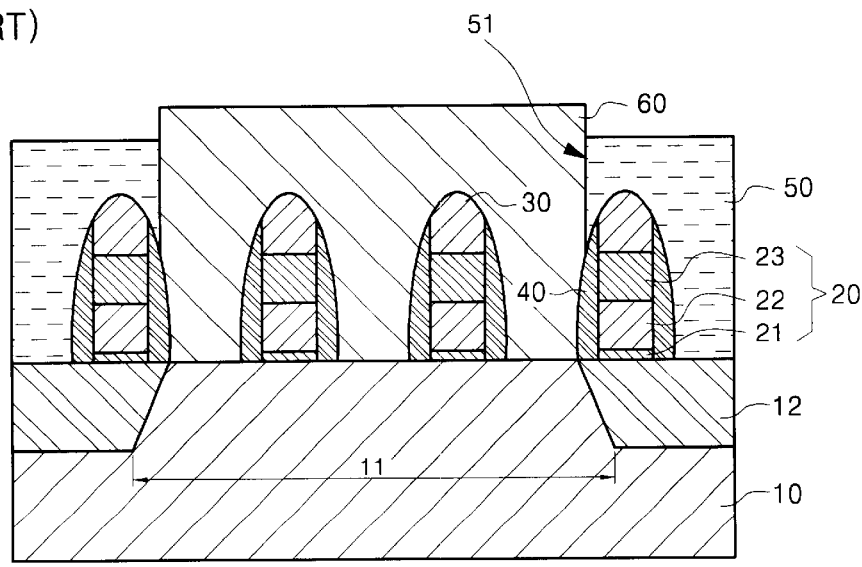
Figure 1E:
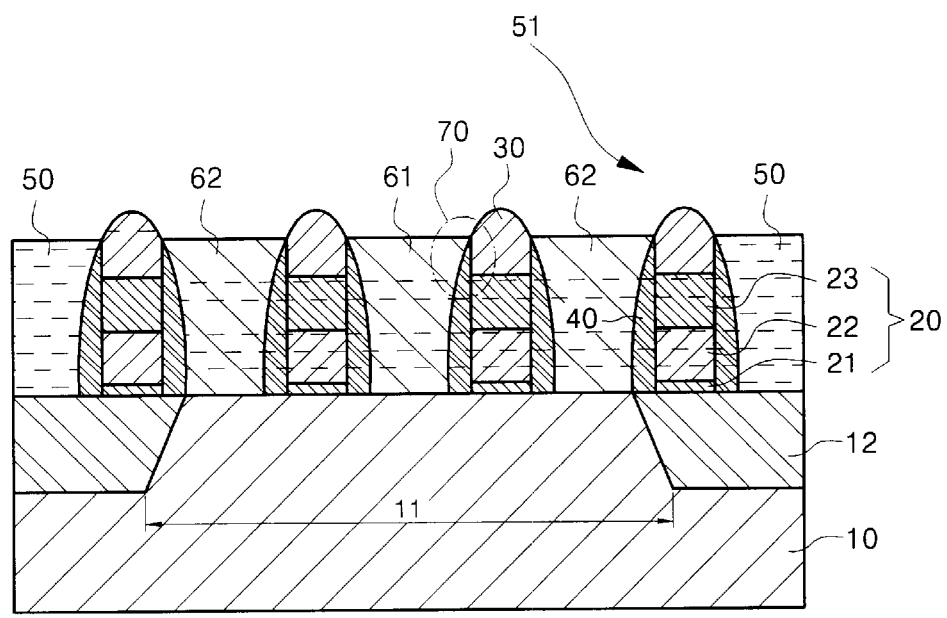
Figure 2A:
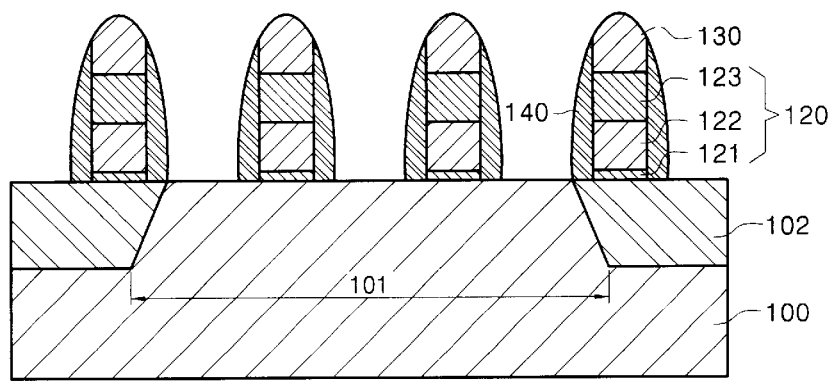
FIGS. 2A to 2F illustrate cross-sectional views of a process of forming a self-aligned contact pad according to a preferred embodiment of the present invention.

First, as shown in FIG. 2A, a semiconductor substrate 100 includes an active region 101 and a non-active region having a device isolation layer 102. A plurality of gates 120 are formed on corresponding gate oxide layers 121, respectively. Each of the plurality of gates 120 includes a polysilicon layer 122 and a tungsten silicide layer 123 which are sequentially stacked on the gate oxide layer 121. A nitride layer 130 is formed on the corresponding tungsten silicide layer 123 as a gate mask. A nitride spacer 140 is formed on both sidewalls of the gate 120 and the nitride layer 130.

More specifically, the gate oxide layer 121, the polysilicon layer 122, the tungsten silicide layer 123, and the nitride layer 130 are sequentially deposited on the semiconductor substrate 100. The nitride layer 130 is patterned using a photoresist pattern (not shown) into a gate mask. Using the patterned nitride layer 130 as the gate mask, the gate oxide layer 121, the polysilicon layer 122 and the tungsten silicide layer 123 are simultaneously etched to form the gate 120. Thereafter, the nitride spacer 140 is formed on both sidewalls of the gate 120 and the nitride layer 130 in a typical manner.

Meanwhile, although not shown in FIG. 2A, after forming the gate 120, a high-density impurity having a predetermined conductivity may be ion-implanted to form source and drain regions. Otherwise, a low-density impurity having a predetermined conductivity is ion-implanted before forming the nitride spacer 140. Thereafter, a high-density impurity having the same conductivity as the low-density impurity is ion-implanted to form source and drain regions having a lightly doped drain (LDD) structure.

Figure 2B:
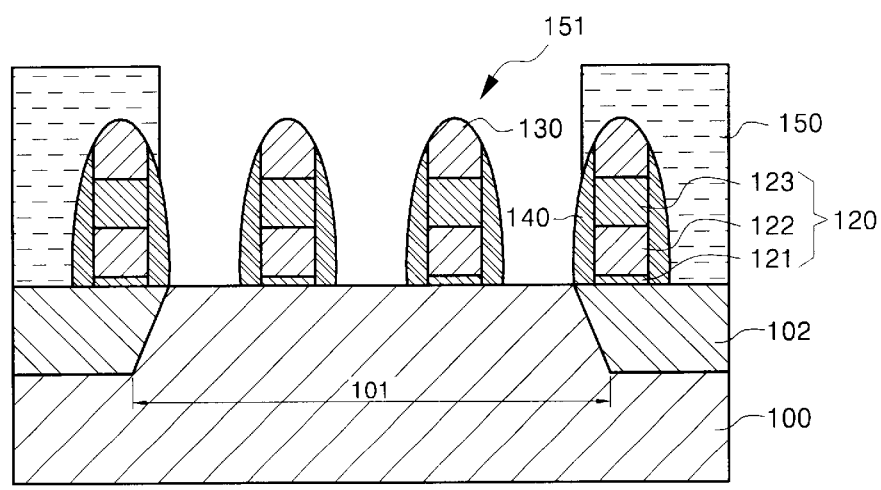

Subsequently, as shown in FIG. 2B, an interlayer insulating layer 150 is deposited over the entire surface of the semiconductor substrate 100 and then etched to form an opening 151. In a subsequent process, DC pads and BC pads will be formed on portions of the active region exposed by the opening 151. The interlayer insulating layer 150 is preferably made of a high-density plasma (HDP) oxide layer and preferably, has a thickness of approximately 5300 Å.

Figure 2C:
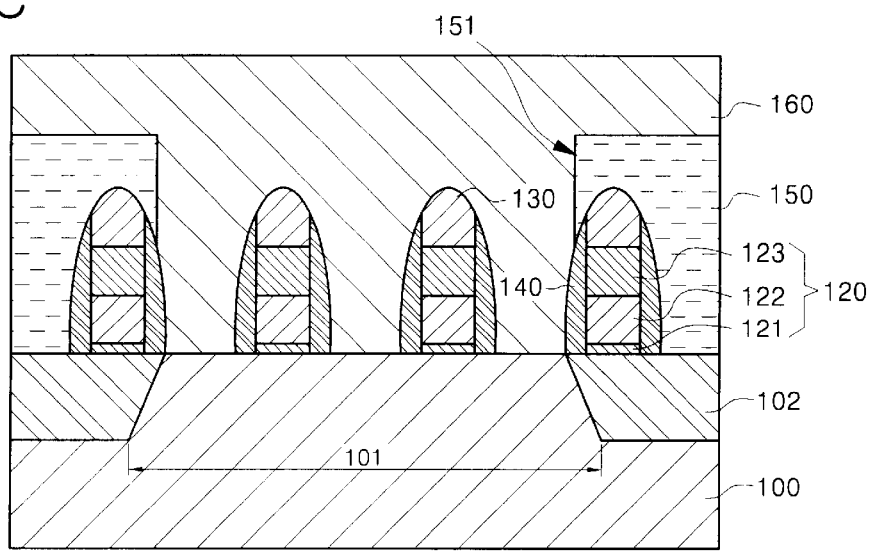

Thereafter, as shown in FIG. 2C, a conductive material layer, e.g., polysilicon layer 160, is deposited over the entire surface of the semiconductor substrate 100.

Figure 2D:
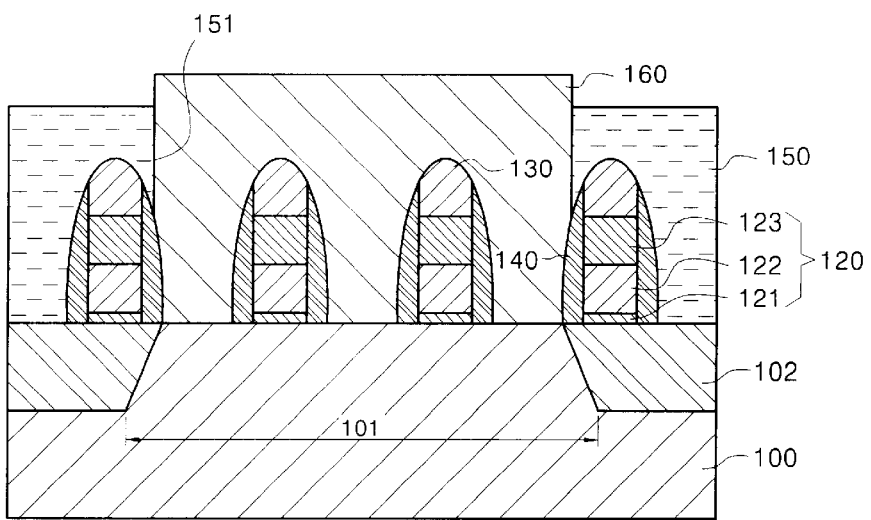

Then, as shown in FIG. 2D, the polysilicon layer 160 is etched-back to electrically insulate the contact pads until the HDP oxide interlayer insulating layer 150 is exposed, so that the polysilicon layer 160 remains in the opening 151. Thereafter, the HDP oxide interlayer insulating layer 150 is over-etched by as much as 500 Å.

Figure 2E:
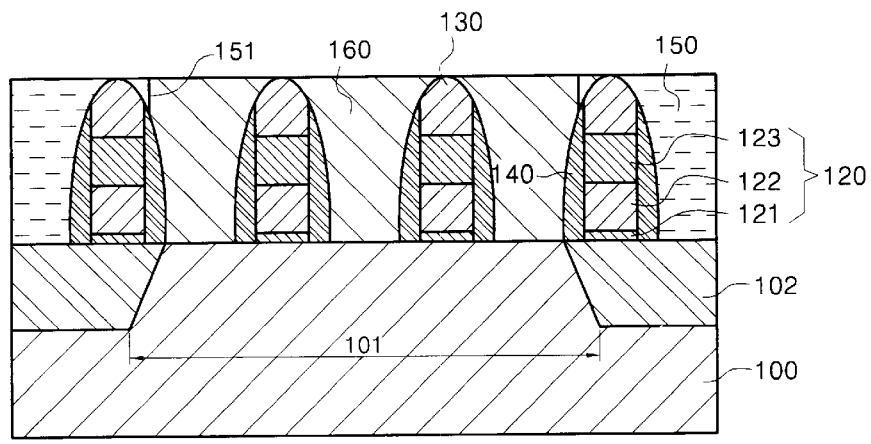

As shown in FIG. 2E, the HDP oxide interlayer insulating layer 150 and the polysilicon layer 160 undergo a first CMP process until the nitride layer 130 is exposed. An oxide slurry is used in the first CMP process so that an etching selectivity ratio of the nitride layer, the oxide layer and the polysilicon layer is 1:2:2.

Figure 2F:
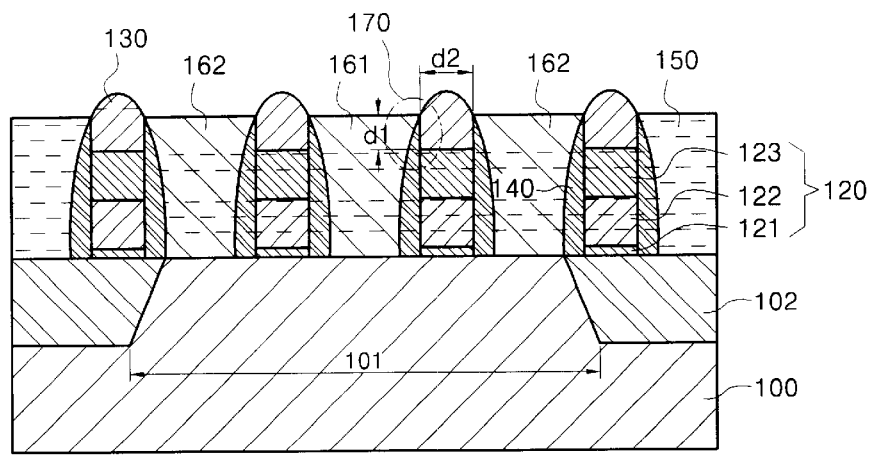

Finally, as shown in FIG. 2F, the HDP oxide interlayer insulating layer 150 and the polysilicon layer (160 of FIG. 2E) undergo a second CMP process to form contact pads 161, 162. A poly slurry is used in the second CMP process so that the polysilicon layer 160 is higher in etching selectivity than the nitride layer 130. The poly slurry etching selectivity ratio of the nitride layer to the polysilicon layer is 1:50. At this time, it is preferred that a thickness d1 from an upper surface of the contact pads 161 and 162 to the tungsten silicide layer 123 is more than 300 Å, and a width d2 of an exposed portion of the nitride layer 130 is more than 30 nm.

Thus, contact pads, i.e., DC pads 161, which are bit line self-aligned contact pads and BC pads 162, which are storage node self-aligned contact pads, are formed.

As a result, the nitride layer 130 and the nitride spacer 140 are sufficiently thick to provide excellent insulation, as indicated by reference numeral 170 in FIG. 2F, thereby preventing defects such as a short circuit between the gate 120 and the contact pads 161 and 162.

Figure 3A:
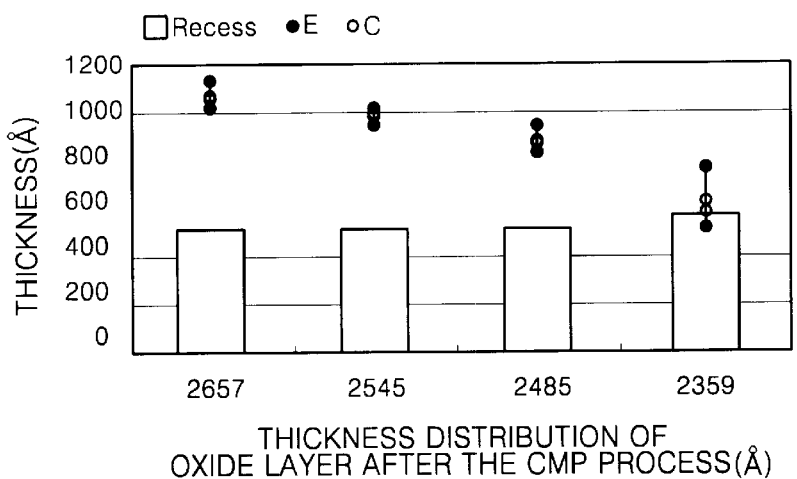
FIG. 3A is a graph illustrating a thickness of a nitride layer with respect to an oxide layer after a CMP process according to the prior art.
Figure 3B:
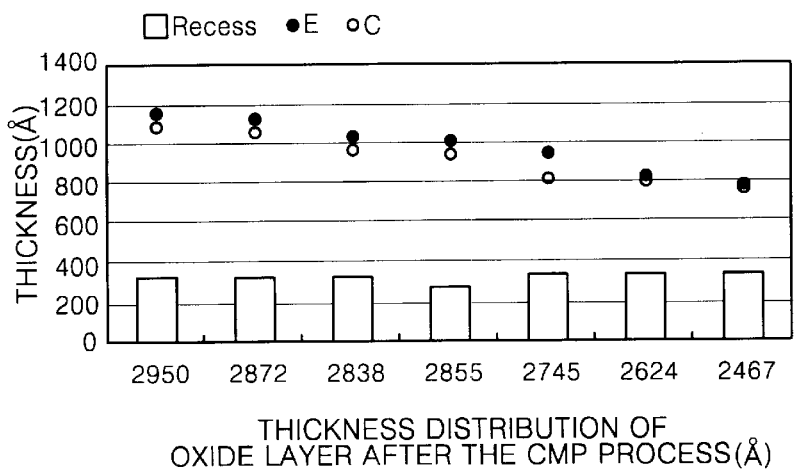
FIG. 3B is a graph illustrating a thickness of a nitride layer with respect to an oxide layer after a CMP process according to a preferred embodiment of the present invention.

FIG. 3A is a graph illustrating a thickness of the nitride layer with respect to the oxide layer after the CMP process according to the prior art. FIG. 3B is a graph illustrating a thickness of the nitride layer with respect to the oxide layer after the CMP process according to a preferred embodiment of the present invention. In FIGS. 3A and 3B, "□" denotes a recess degree of the polysilicon layer for the contact pads, "E" denotes an edge portion of a chip on a wafer, and "C" denotes a central portion of the chip on the wafer. In the graphs of FIGS. 3A and 3B, a vertical axis denotes a thickness of the nitride layer, and a horizontal axis denotes a thickness of the HDP oxide layer after the CMP process.

As shown in FIG. 3A, a recess degree of the polysilicon layer is about 500 Å. In this case, the HDP oxide layer must have a minimum thickness of 800 Å in order to prevent a short circuit between the gate and the contact pads. However, when the oxide layer that is formed in the chip on the flat zone of the wafer has a thickness of 2359 Å, the nitride layer formed on an edge portion of the chip is below 500 Å, leading to a defect such as a short circuit between the gate and the contact pads.

On the other hand, as shown in FIG. 3B, a recess degree of the polysilicon layer is about 300 Å. In this case, the HDP oxide layer must have a minimum thickness of 600 Å to prevent a short circuit between the gate and the contact pads. The nitride layer formed in all of the chips on the wafer has a thickness of greater than 500 Å, thereby preventing generation of a defect such as a short circuit between the gate and the contact pads.

Figure 4:
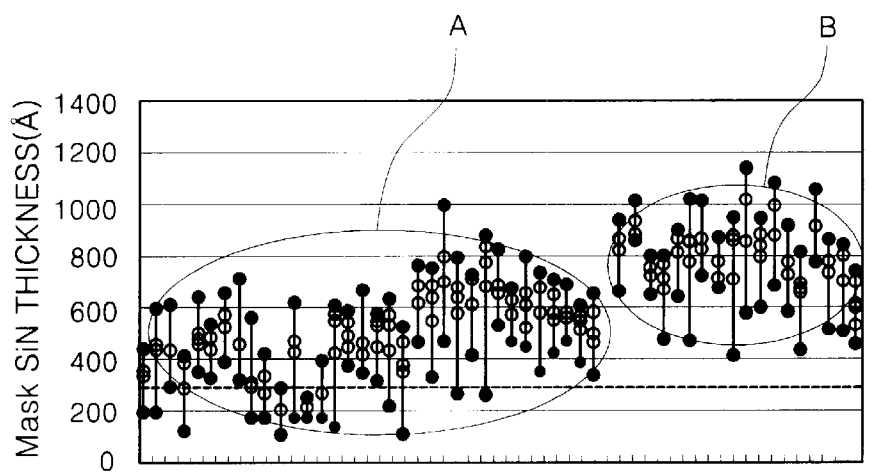
FIG. 4 is a graph illustrating a thickness distribution of the nitride layer when the self-aligned contact pads are formed according to the prior art and according to a preferred embodiment of the present invention.

FIG. 4 is a graph illustrating a thickness distribution of the nitride layer when the self-aligned contact pads are formed according to a method of the prior art and according to a preferred embodiment of the present invention. In the graph of FIG. 4, section "A" denotes a thickness distribution of the nitride layer when the self-aligned contact pads are formed according to the prior art, and section "B" denotes a thickness distribution of the nitride layer when the self-aligned contact pads are formed according to a preferred embodiment of the present invention.

As shown in FIG. 4, in the case of the prior art "A", most of the nitride layers have a thickness of less than 500 Å, and many nitride layers have a thickness of less than 300 Å, wherein 300 Å is the minimum allowable thickness of the nitride layer. However, in the case of the present invention "B", most of the nitride layers have a thickness of greater than 500 Å, and few nitride layers have a thickness less than 300 Å, wherein 300 Å is the minimum allowable thickness of the nitride layer.

As described herein, the self-aligned contact pads are formed according to the present invention using a multi-step CMP process, i.e., a two-step CMP process, and therefore excessive consumption of the nitride layer may be prevented, thereby preventing a defect such as a short circuit between the gate and the contact pads.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of forming a self-aligned contact pad for use in a semiconductor device, comprising:

forming a gate having a gate mask formed thereon on a semiconductor substrate, the semiconductor substrate including an active region and a non-active region;

forming a spacer on both sidewalls of the gate and the gate mask;

forming an interlayer insulating layer over the entire surface of the semiconductor substrate, the interlayer insulating layer including an opening formed on the active region of the semiconductor substrate;

forming a conductive material layer over the entire surface of the semiconductor substrate to cover the interlayer insulating layer;

etching-back the conductive material layer until the interlayer insulating layer is exposed; and performing a multi-step chemical mechanical polishing (CMP) process including a first CMP process for etching the conductive material layer and the interlayer insulating layer using a first slurry;

and a second CMP process for etching the conductive material layer using a second slurry, wherein the second slurry has a higher selectivity in the conductive material layer than in the gate mask, to form contact pads in the opening of the interlayer insulating layer, such that the contact pads are electrically insulated from each other.

2. The method as claimed in claim 1, wherein the gate includes a gate oxide layer, a polysilicon layer and a tungsten silicide layer sequentially stacked on the semiconductor substrate.

3. The method as claimed in claim 1, wherein the first CMP process is performed using the first slurry until the gate mask is exposed.

4. The method as claimed in claim 3, wherein the first slurry is an oxide slurry such that an etching selectivity ratio of the gate mask, the conductive material layer and the interlayer insulating layer is 1:2:2.

5. The method as claimed in claim 4, wherein the gate mask is a nitride layer, the conductive material layer is a polysilicon layer, and the interlayer insulating layer is a high-density plasma (HDP) oxide layer.

6. The method as claimed in claim 1, wherein in the second CMP process, a width of the gate mask exposed between the contact pads is at least 30 nm, and a thickness of the gate mask is at least 300 Å.

7. The method as claimed in claim 6, wherein the second slurry is a poly slurry such that an etching selectivity ratio of the gate mask and the polysilicon layer is 1:50.

8. The method as claimed in claim 7, wherein the gate mask is a nitride layer, the conductive material layer is a polysilicon layer, and the interlayer insulating layer is a HDP oxide layer.

9. A method of forming a self-aligned contact pad for use in a semiconductor device, comprising:

forming a gate having a gate mask formed thereon on a semiconductor substrate, the semiconductor substrate including an active region and a non-active region;

forming a spacer on both sidewalls of the gate and the gate mask;

forming an interlayer insulating layer over the entire surface of the semiconductor substrate, the interlayer insulating layer including an opening formed on the active region of the semiconductor substrate;

forming a conductive material layer over the entire surface of the semiconductor substrate to cover the interlayer insulating layer;

etching-back the conductive material layer until the interlayer insulating layer is exposed and then over-etching the interlayer insulating layer; and performing a multi-step chemical mechanical polishing (CMP) process to form contact pads in the opening of the interlayer insulating layer, such that the contact pads are electrically insulated from each other.

* * * * *